United States Patent
Nakazawa et al.

(10) Patent No.: US 6,399,008 B1
(45) Date of Patent: Jun. 4, 2002

(54) METHOD FOR PROCESSING CERAMIC GREEN SHEETS

(75) Inventors: Mutsuo Nakazawa; Satoshi Takakuwa; Hiroshi Takahashi; Akira Yamanaka; Mitsuo Ueno; Katsuhiro Oyama, all of Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 09/447,352

(22) Filed: Nov. 22, 1999

(30) Foreign Application Priority Data

Nov. 25, 1998 (JP) .............................. 10-334036

(51) Int. Cl.[7] .............................. B29C 35/08; H05B 6/00
(52) U.S. Cl. ........................................ 264/400; 264/430
(58) Field of Search ........................... 264/430, 400

(56) References Cited

U.S. PATENT DOCUMENTS 4,115,683 A * 9/1978 Clark et al. ............... 219/121 L
4,377,736 A * 3/1983 Daunt et al.
6,172,330 B1 * 1/2001 Yamamoto et al. ....... 219/121.7

FOREIGN PATENT DOCUMENTS

| JP | 06234087 | * | 8/1994 |
| JP | 07193374 | * | 7/1995 |

* cited by examiner

Primary Examiner—Christopher A. Fiorilla
(74) Attorney, Agent, or Firm—Lowe Hauptman Gilman & Berner, LLP (57) ABSTRACT

Processing along one circular path is performed by irradiating a laser beam to a ceramic green sheet attached on an outer peripheral surface of a rotating drum, and the processing path is changed by moving at least one of the rotating drum and a beam irradiated position through a predetermined distance in the direction of drum centerline each time the processing on one circular path is completed. If the laser beam is intermittently irradiated to the ceramic green sheet, a matrix of through holes or concave portions can be easily formed in the ceramic green sheet.

42 Claims, 10 Drawing Sheets

METHOD FOR PROCESSING CERAMIC GREEN SHEETS

BACKGROUND OF THE INVENTION

1. Field of the Invention

The present invention relates to a method and an apparatus for processing a ceramic green sheet, which is used for manufacturing a multilayer ceramic electronic component, by laser beam irradiation.

2. Description of the Related Art

A multilayer chip inductor, which is known as a kind of multilayer ceramic electronic component, is manufactured as described below.

First, a ceramic green sheet of a size such that many chips can be obtained is prepared, and a matrix of through holes are formed at predetermined intervals in this ceramic green sheet. These through holes are formed in the following way. While an X-Y table on which the ceramic green sheet is held is moved in the X direction at a predetermined speed, a laser beam is applied intermittently to the ceramic green sheet to form a row of through holes. Subsequently, the table is stopped once, and row change is made by moving the table in the Y direction through a predetermined distance. Then, while the table is moved in the X direction at a predetermined speed, a laser beam is again applied intermittently to the ceramic green sheet. This operation is repeated until all the through holes are formed.

Next, screen printing of coil conductor paste is performed in a predetermined pattern on one surface of the ceramic green sheet in which the matrix of through holes is formed. The patterns of conductor paste are formed in number corresponding to the number of chips to be obtained, and some of paste patterns are charged in the through holes simultaneously with the printing.

Next, the ceramic green sheets on which paste patterns corresponding to the number of chips to be obtained are formed and ceramic green sheets having neither through holes nor paste patterns are stacked in a predetermined order and are pressed. By this stacking and pressing operation, the paste patterns between the sheets are connected in a coil form via the charged paste in the through holes.

Next, the multilayer sheet laminate is cut to a unit dimension corresponding to the dimension of the component, and the multilayer chips obtained by the cutting are fired. Finally, electrode paste is applied and baked onto the external surface of the fired chip to form an external electrode. As necessary, solder film or the like is formed on this surface.

In the conventional processing method, the matrix of through holes is formed in a ceramic green sheet as described above. That is to say, while a table is moved in the X direction at a predetermined speed, a laser beam is applied intermittently to the ceramic green sheet to form a row of through holes. Subsequently, the table is stopped once, and row change is made by moving the table in the Y direction through a predetermined distance. Then, while the table is moved in the X direction at a predetermined speed, a laser beam is again applied intermittently to the ceramic green sheet. This operation is repeated until all the through holes are formed.

However, in such a processing method, when the table is moved in the X direction to form a row of through holes, an acceleration region needed for the table to reach the predetermined speed and a deceleration region needed for the table to stop must be provided. Also, time for moving the table in the Y direction, which has been stopped after the row of through holes were formed, and for stopping the table again is necessary each time the row change is made.

That is to say, at the time of processing, the table must be moved needlessly in the X direction through a distance corresponding to the aforementioned acceleration region and deceleration region. Also, since the time for row change is necessary in proportion to the number of row changes. Therefore considerably much time is needed to form the desired matrix of through holes in one ceramic green sheet even if the table movement speed in the X and Y directions is increased.

SUMMARY OF THE INVENTION

An object of the present invention is to provide a new processing method in which processing for forming a matrix etc. of through holes or concave portions in a ceramic green sheet by laser beam irradiation can be performed at a high speed, and to provide a processing apparatus suitable for carrying out this processing method.

To attain the above object, a first processing method in accordance with the present invention comprises the steps of: rotating a cylindrical drum in which a ceramic green sheet is removably attached on an outer peripheral surface thereof with the drum centerline being the axis; processing the ceramic green sheet along one circular path by irradiating a laser beam toward the outer peripheral surface of the rotating drum; and changing the processing path by moving at least one of the rotating drum and a beam irradiated position through a predetermined distance in the direction of drum centerline each time the processing on one circular path is completed.

According to this processing method, the processing along the circular path can be performed repeatedly on the ceramic green sheet attached on the outer peripheral surface of the rotating drum while the position is changed in the direction of drum centerline. If the laser beam is applied intermittently to the ceramic green sheet, a matrix of through holes or concave portions can be formed easily on the ceramic green sheet. Also, if the laser beam is applied continuously to the ceramic green sheet, the ceramic green sheet can be cut to a zonation shape, or parallel concave portions can be formed in the ceramic green sheet. Since the processing on the ceramic green sheet can be performed without the stoppage of rotation of the drum, the processing time can be shortened significantly and the work efficiency can be increased as compared with the conventional processing method.

Also, a second processing method in accordance with the present invention comprises the steps of: rotating a cylindrical drum in which a ceramic green sheet is removably attached on an outer peripheral surface thereof with the drum centerline being the axis; and processing the ceramic green sheet along a spiral path by irradiating a laser beam toward the outer peripheral surface of a rotating drum while at least one of the rotating drum and a beam irradiated position is moved in the direction of drum centerline.

According to this processing method, the processing along the spiral path can be performed on the ceramic green sheet attached on the outer peripheral surface of the rotating drum. If the laser beam is applied intermittently to the ceramic green sheet, a matrix of through holes or concave portions can be formed easily on the ceramic green sheet. Also, if the laser beam is applied continuously to the ceramic green sheet, the ceramic green sheet can be cut to a spiral shape, or spiral concave portions can be formed in the ceramic green sheet. Since the processing on the ceramic green sheet can be performed without the stoppage of rotation of the drum, the processing time can be shortened significantly and the work efficiency can be increased as compared with the conventional processing method.

On the other hand, a first processing apparatus in accordance with the present invention comprises: a cylindrical drum capable of attaching the ceramic green sheet removably on an outer peripheral surface thereof; first driving means for rotating the drum with the drum centerline being the axis; beam irradiating means for irradiating a laser beam toward the outer peripheral surface of the rotating drum; second driving means for changing a processing path by moving at least one of the rotating drum and a beam irradiated position in the direction of drum centerline; first control means for controlling the first driving means and the beam irradiating means so that the ceramic green sheet is processed along one circular path; and second control means for controlling the second driving means so that at least one of the rotating drum and the beam irradiated position is moved through a predetermined distance in the direction of drum centerline each time the processing on one circular path is completed.

According to this first processing apparatus, the above-described first processing method can be carried out properly and stably.

Also, a second processing apparatus in accordance with the present invention comprises: a cylindrical drum capable of attaching the ceramic green sheet removably on an outer peripheral surface thereof; first driving means for rotating the drum with the drum centerline being the axis; beam irradiating means for irradiating a laser beam toward the outer peripheral surface of the rotating drum; second driving means for obtaining a spiral path by moving at least one of the rotating drum and a beam irradiated position in the direction of drum centerline; and control means for controlling the first driving means, beam irradiating means, and second driving means so that the ceramic green sheet is processed along the spiral path.

According to this second processing apparatus, the above-described second processing method can be carried out properly and stably.

The above and other objects, features, and advantages of the present invention will become apparent from the following description and the accompanying drawings.

DESCRIPTION OF THE PREFERRED EMBODIMENTS

Figure 1:
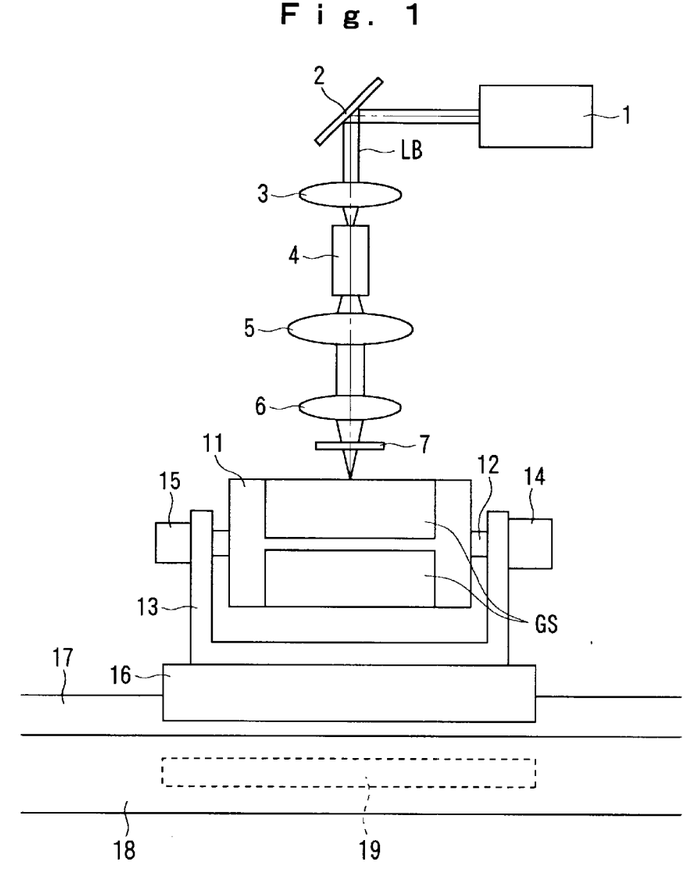
FIG. 1 is a schematic view of an apparatus in accordance with one embodiment of the present invention.

FIG. 1 schematically shows an apparatus in accordance with one embodiment of the present invention.

In FIG. 1, reference numeral 1 denotes a laser oscillator, LB denotes a laser beam, 2 denotes a mirror, 3 denotes a condensing lens, 4 denotes a homogenizer, 5 denotes a relay lens, 6 denotes an objective lens, and 7 denotes a shield plate which allows the penetration of laser beam. Also, reference numeral 11 denotes a drum, GS denotes a ceramic green sheet (hereinafter referred simply to as a green sheet), 12 denotes a drum shaft, 13 denotes a support frame for supporting the drum shaft 12, 14 denotes a motor for rotating the drum 11, 15 denotes an encoder for detecting the angle of rotation of the drum 11, 16 denotes a rail guide provided on the bottom surface of the support frame 13, 17 denotes a rail, 18 denotes a base for supporting the rail 17, and 19 denotes a linear motor for moving the support frame 13.

The laser oscillator 1 preferably comprises a YAG laser oscillator of CW-Q oscillation that oscillates fundamental waves or higher harmonic waves, but another laser oscillator such as $CO_2$ laser and eximer laser can also be used. The laser beam LB emitted from the laser oscillator 1 is reflected by the mirror 2, and then goes into the homogenizer 4 through the condensing lens 3. When a configuration in which the laser beam LB emitted from the laser oscillator 1 goes directly into the homogenizer 4 is used, the aforementioned mirror 2 and condensing lens 3 are unnecessary.

The homogeneous laser beam LB going out of the outlet of the homogenizer 4 reaches the shield plate 7 on the lower side of the relay lens 5 and the objective lens 6 through these lenses. The shield plate 7 allows the penetration of the laser beam LB, and also plays a role in preventing the objective lens 6 from being stained by processing dust created when the laser beam LB is applied to the green sheet GS. The shield plate 7 comprises a laser beam non-penetrating plate such as a metal plate formed with a beam penetrating hole, a laser beam penetrating plate, such as a glass plate, a laser beam non-penetrating plate formed with a laser beam penetrating portion, or a plate formed by stacking these plates.

The laser beam LB reaching the shield plate 7 through the objective lens 6 penetrates the shield plate 7, and is applied to the green sheet GS in a predetermined shape, for example, a circular shape. In this case, the irradiation position of the laser beam LB with respect to the green sheet GS lies on the drum centerline (refer to the dashed line in FIG. 7) when the drum 11 is viewed from the upper side, and the centerline of the laser beam LB applied to this position agrees with the normal line from the center of the irradiation position.

Figure 2:
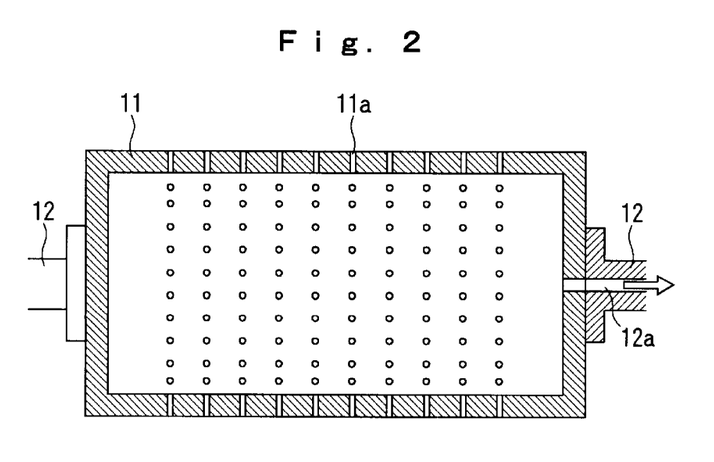
FIG. 2 is a longitudinal sectional view of a drum shown in FIG. 1.

As shown in FIG. 2, the drum 11 is made of a metal such as stainless steel, and is formed into a cylindrical shape, having a drum shaft 12 at the center of each end face thereof. The axis of each of the drum shafts 12 agrees with the drum centerline. The shafts 12 of the drum 11 are supported rotatably by the support frame 13. Also, a number of tiny suction holes 11a communicating with an inside cavity are provided on the outer peripheral surface of the drum 11 in a predetermined arrangement, and a suction passage 12a communicating with the inside cavity is provided in one of the drum shafts 12. This suction passage 12a is connected to a suction source (not shown) such as a vacuum pump via a rotary joint, so that a negative pressure (a sucking force) can be applied to all of the suction holes 11a in the outer peripheral surface of the drum by the operation of the suction source.

Figure 3A:
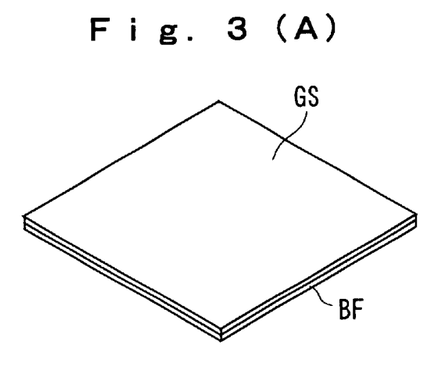
FIG. 3(A) is a perspective view of a green sheet shown in FIG. 1.

As shown in FIG. 3(A), the upper surface of the green sheet GS is rectangular in shape, and the lower surface thereof is supported by a base film OF consisting of a flexible film such as PET. This green sheet GS can be obtained by a method in which a predetermined thickness of ceramic slurry prepared by mixing a binder and a solvent etc. with ceramic powder is applied onto a zonation base film and is dried, and then a zonation product is cut to a predetermined size, or the zonation product is punched to a predetermined sized and is taken out. Needless to say, the green sheet GS can also be obtained by applying ceramic slurry onto a rectangular base film and drying it. The slurry material containing ceramic powder, which is suitable for the electronic component to be manufactured, is prepared appropriately.

Figure 3B:
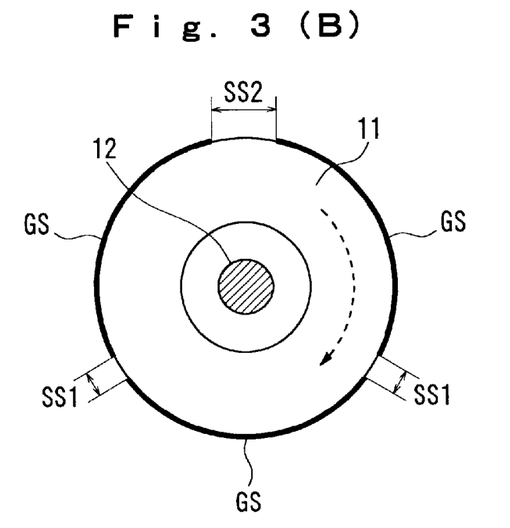
FIG. 3(B) is an end view of a drum, showing a state in which green sheets are attached on the drum.

This green sheet GS is disposed in such a manner that the surface on the base film BS side is in contact with the outer peripheral surface of the drum 11, and is attached on the outer peripheral surface of the drum 11 by a sucking force acting through the suction holes 11a. If the sucking force is released, the green sheet GS can be removed easily from the outer peripheral surface of the drum 11. As shown in FIG. 3(B), in the example shown in this figure, three green sheets GS are attached on one drum 11, and gaps SS1, SS2 substantially parallel to the drum centerline are formed between the three attached green sheets GS. The gap SS2 is larger than the gap SS1, and this gap SS2 is used as a part of a later-described path change region.

Figure 4:
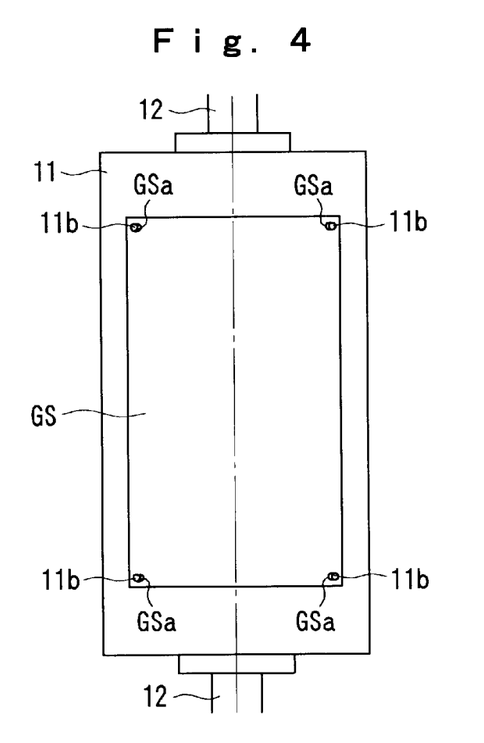
FIG. 4 is a view showing a method for attaching the green sheet on the drum.

To perform the operation for attaching the green sheet GS on the outer peripheral surface of the drum 11, a method in which positioning marks are put in advance on the outer peripheral surface of the drum 11, and the green sheet GS is attached so that the sheet coincides with the marks can be used. Also, a method in which a concave portion coinciding with the sheet shape is formed in advance on the outer peripheral surface of the drum 11, and the green sheet GS is attached so that the sheet is fitted in this concave portion can be used. Further, a method shown in FIG. 4 can be used, in which positioning holes GSa are formed in advance at four corners etc. of a green sheet GS and, on the other hand, positioning pins 11b corresponding to the positioning holes GSa are erected in advance on the outer peripheral surface of the drum 11, and the green sheet GS is attached by fitting the positioning holes GSa on the positioning pins 11b.

The shafts 12 of the drum 11 are rotatably supported by the support frame 13. One of the drum shafts 12 is connected with the motor 14 for rotating the drum 11, and the other of the drum shafts 12 is connected with the encoder 15 for detecting the angle of rotation of the drum 11. Also, the rail guide 16 provided on the bottom surface side of the support frame 13 engages with the rail 17 on the base 18, so that the support frame 13 can be moved linearly in the transverse direction in FIG. 1. The linear motor 19 plays a role in moving the support frame 13 along the rail 17.

Figure 5:
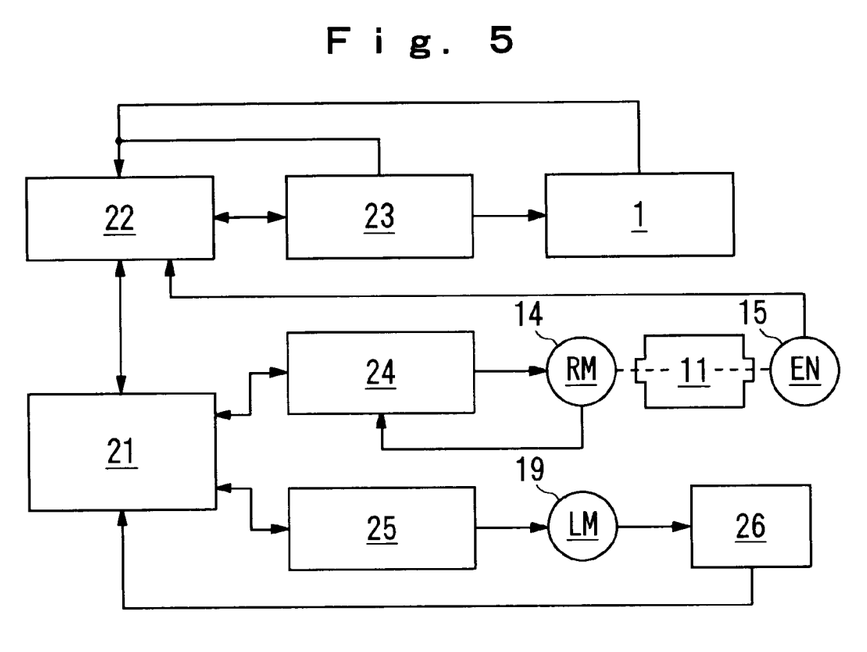
FIG. 5 is a block diagram of a processing control system for the apparatus shown in FIG. 1.

FIG. 5 is a block diagram of a processing control system for the apparatus shown in FIG. 1. In FIG. 5, reference numeral 21 denotes a motion controller, 22 denotes a laser emission controller, 23 denotes a laser power source, 24 denotes a motor power source for the motor 14 for rotating the drum 11, 25 denotes a motor power source for the linear motor 19 for moving the support frame 13, 26 denotes a linear scale for detecting the position of the support frame 16, and 15 denotes the encoder for detecting the angle of rotation of the drum 11.

A control signal for controlling the operation of the motor 14 is sent from the motion controller 21 to the motor power source 24. A control signal for controlling the operation of the linear motor 19 is sent from the motion controller 21 to the motor power source 25. Also, a control signal for controlling laser beam irradiation is sent from the motion controller 21 to the laser emission controller 22.

When the motor 14 is operating, a feedback signal is fed from the motor 14 to the motor power source 24. When the linear motor 19 is operating or stopping, a feedback signal is fed from the linear scale 26 to the motion controller 21. A rotation angle signal (angle of rotation) of the encoder 15 is fed to the laser emission controller 22, and based on this signal, a control signal for controlling the oscillation of the laser oscillator 1 is sent from the laser emission controller 22 to the laser power source 23. Also, the oscillation data (number of emissions) of the laser oscillator 1 and the operation data of the laser power source 23 are fed back to the laser emission controller 22.

Now, a method for forming a matrix of through holes SH in the green sheet GS by using the aforementioned apparatus will be described with reference to FIGS. 6 and 7(A) to 7(D).

Figure 6:
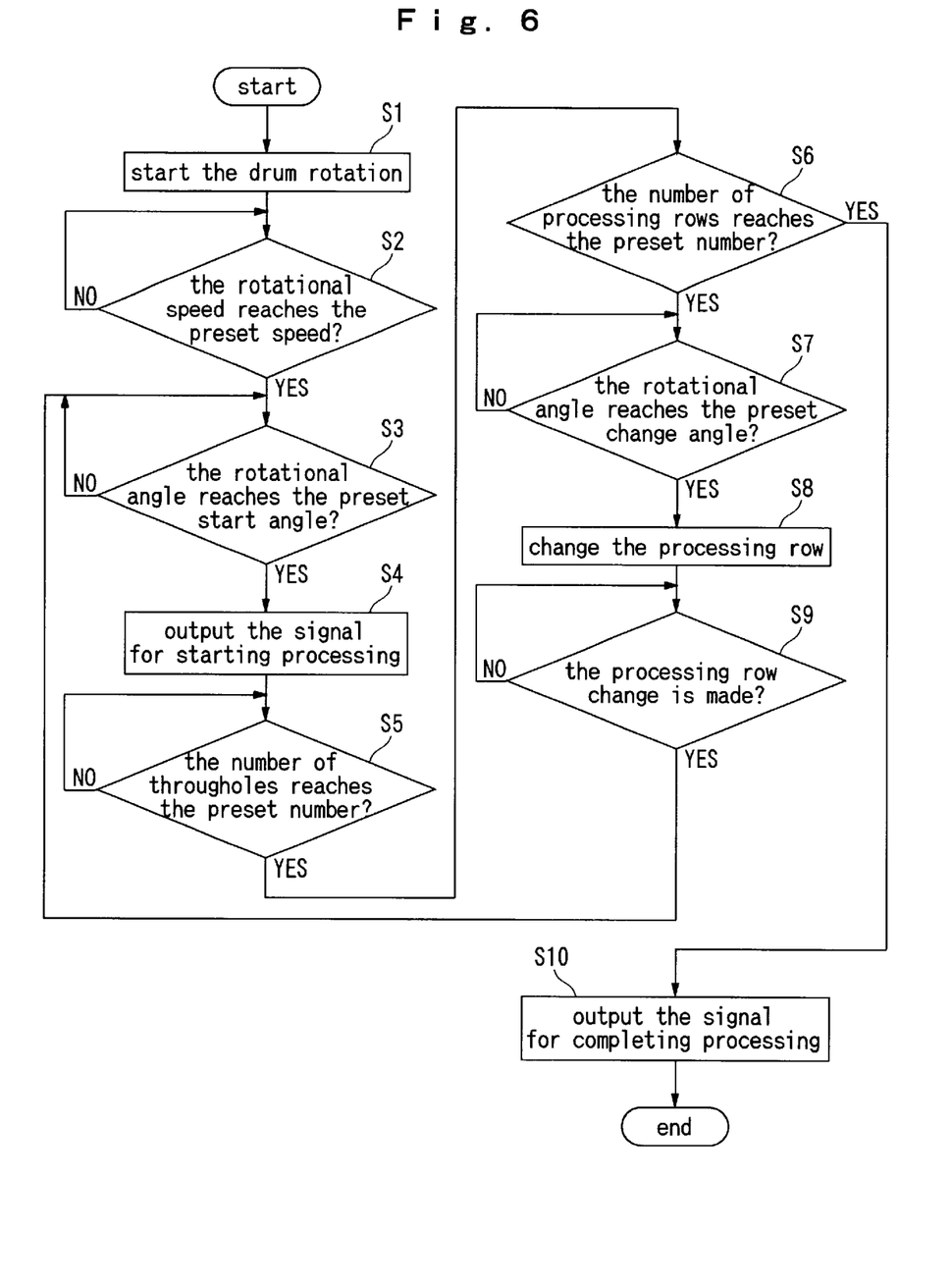
FIG. 6 is a flowchart showing a method for forming a matrix of through holes in the green sheet by using the apparatus shown in FIG. 1.

After three green sheets GS are attached on the outer peripheral surface of the drum 11, the rotation of the drum 11 is started by the motor 14 (Step S1, in FIG. 6), and it is judged whether or not the rotational speed of the drum 11 has reached a preset rotational speed (Step S2 in FIG. 6).

After the rotational speed of the drum 11 has reached the preset rotational speed, processing in the first row is started when the angle of rotation of the drum 11 reaches a preset processing start angle (Steps S3 and S4 in FIG. 6).

Figure 7A:
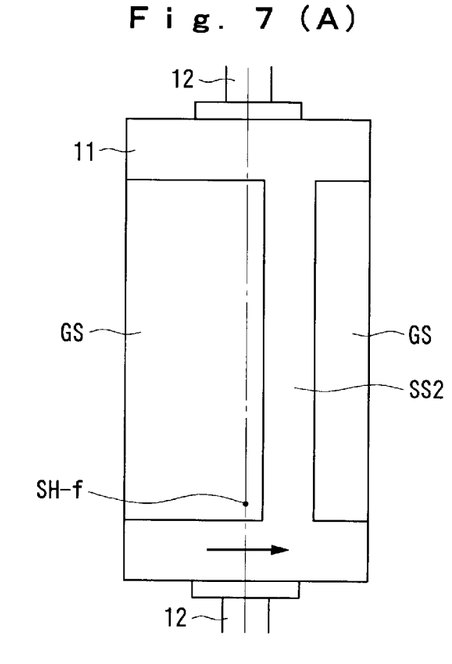
FIGS. 7(A) to 7(D) are top views of the drum, showing a state in which the matrix of through holes is formed in the green sheet.
Figure 7B:
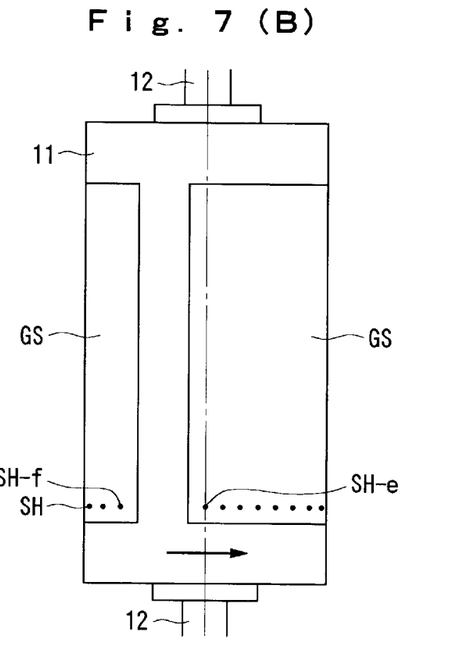

Specifically, when the angle of rotation of the drum 11 reaches the preset processing start angle, a laser beam LB is emitted toward the green sheet GS on the outer peripheral surface of the drum 11 to form a first through hole SH-f (see FIG. 7(A)). Subsequently, a laser beam LB is intermittently emitted at each preset angle of rotation, by which a row of a predetermined number of through holes SH arranging at equal intervals in the circumferential direction is formed on the three green sheets GS (see FIG. 7(B)). In the example shown in FIG. 7, of the three green sheets GS shown in FIG. 3(B), the left-hand green sheet GS adjoining via the gap SS2 is selected as the green sheet GS in which the through holes SH are formed first.

The formation of a through hole SH by laser beam irradiation is carried out by melting and evaporating a beam irradiated portion of the green sheet GS by using the energy of the irradiated laser beam LB. In this laser beam irradiation, it is preferable that the through hole SH be formed in the green sheet GS only without the processing of the base film BF. Also, to prevent the outer peripheral surface of the drum 11 from being processed by a laser beam LB, a laser beam LB is not emitted in the angle region including the gaps SS1 and SS2 shown in FIG. 3(B).

After the processing in the first row has been started, it is judged whether or not the number of processing operations (total number of through holes SH) in the first row has reached a preset number of processing operations. When the last through hole SH-e in the first row has been formed in the third green sheet GS (see FIG. 7(B)), it is judged whether or not the number of processing rows has reached a preset number of processing rows (Steps S5 and S6 in FIG. 6).

When the number of processing rows has not reached the preset number of processing rows, a change of processing row is made when the angle of rotation of the drum 11 reaches a preset processing row change angle (Steps S7 and S8 in FIG. 6).

Figure 7C:
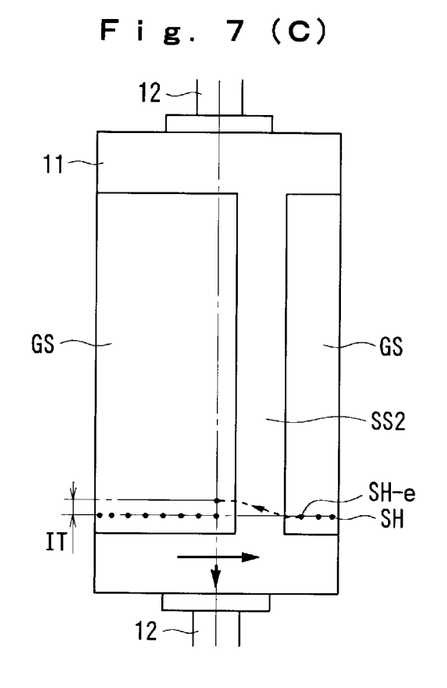

Specifically, when the angle of rotation of the drum 11 reaches the preset processing row change angle, the support frame 13 for the drum 11 is moved through a predetermined distance IT in the direction of drum centerline by the linear motor 19 (see FIG. 7(C)). Thereby, the processing path is changed through the distance IT in the direction of drum centerline by utilizing the region containing the gap SS2 shown in FIG. 3(B), by which the row change is made. Needless to say, a laser beam LB is not emitted during the time when this path change is made.

After the row change is made, the process goes from Step 9 to Step 3, and a row of the predetermined number of through holes SH arranging at equal intervals in the circumferential direction is formed on the three green sheets GS according to Steps S3 through S5 in the same way as described above. When the number of processing operations in the second row has reached the preset number of processing operations, the processing row is changed according to Steps S7 and S8 in the same way as described above. Subsequently, the formation of a row of through holes and the row change are repeated until the number of rows of through holes reaches the preset number of processing rows.

Figure 7D:
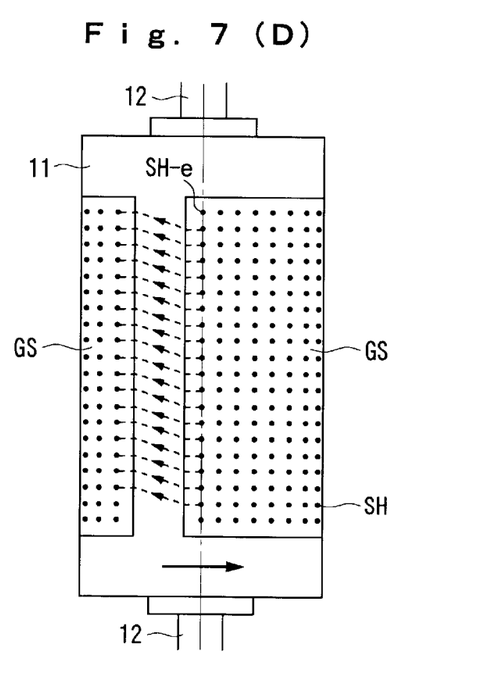

When the last through hole SH-e in the last row has been formed and the number of rows of through holes has reached the preset number of processing rows, a series of processing is completed (Step S10 in FIG. 6, see FIG. 7(D)). After the processing is completed, the green sheets GS are removed from the drum 11.

Thus, according to this embodiment, the laser beam LB is irradiated intermittently toward the green sheets GS attached on the outer peripheral surface of the drum 11 while the drum 11 is rotated at a predetermined rotational speed by the motor 14, by which a row of through holes SH arranging at equal intervals in the circumferential direction can be formed in the green sheets GS. Also, the drum 11 is moved through the predetermined distance in the direction of drum centerline by the linear motor 19 just before the drum 11 makes one turn, by which a desired matrix of through holes SH can be formed in the green sheets GS.

Since the matrix of through holes SH can be formed in the green sheets GS attached on the outer peripheral surface of the drum 11 without the stoppage of rotation of the drum 11, through holes SH on the order of one thousand to ten thousand per second can be formed. As compared with the conventional processing method, the time taken for forming a desired matrix of through holes SH in one green sheet GS is shortened significantly, so that this method can properly meet a requirement for high-speed processing.

Also, since the processing speed is high and moreover the same processing can be performed on the three green sheets GS attached on the outer peripheral surface of the drum 11, the operation efficiency is increased. Therefore, this method contributes greatly to reducing the operation cost and the unit price of electronic component.

Although the method in which three green sheets GS are attached on the outer peripheral surface of the drum 11 has been shown in the above-described embodiment, one or two or more than three green sheets GS can be attached to perform the same processing as described above.

Also, if a portion corresponding to the gap (reference character SS2 in FIG. 3(B)) provided for processing path change is provided on the green sheet side, this gap is not necessarily needed. Even in the case where the green sheets are attached in a state in which there is no gap at all, the same processing as described above can be performed by the intermittent irradiation of laser beam LB.

Further, if one through hole SH cannot be pierced by one operation of laser beam irradiation because of the physical properties of the green sheet GS and/or the property of the irradiated laser beam LB, the processing may be performed two or more times along one path before the processing path is changed.

In the above-described embodiment, when the processing path is changed, the drum 11 is moved through a predetermined distance in the direction of drum centerline. In the case where the weight of the drum 11 is so large that vibrations are generated on the drum 11 accompanied with stoppage of the movement thereof, antivibration measures as described below may be taken.

Specifically, if the gap (reference character SS2 in FIG. 3(B)) provided for the processing path change is widened to prolong the drum movement time for the processing path change, the vibrations can be less prone to occur as compared with the case where the drum movement time is short.

Figure 8:
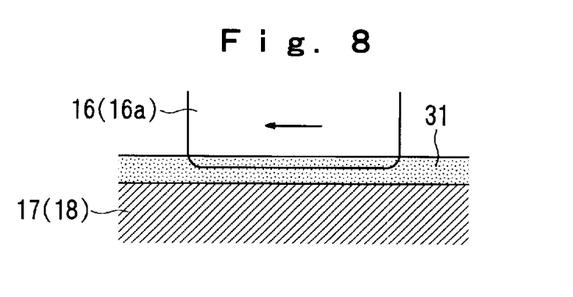
FIG. 8 is a view showing one example of an antivibration mechanism.

FIG. 8 shows one example of an antivibration mechanism. In this mechanism, the rail guide 16 of the support frame 13 or a damping member 16a provided on the rail guide 16 is in contact with damping grease 31 provided on the rail 17 or the base 18. According to this mechanism, by using the viscous resistance of the damping grease 31, the occurrence of vibrations can be restrained and also vibration damping can be performed effectively.

Figure 9:
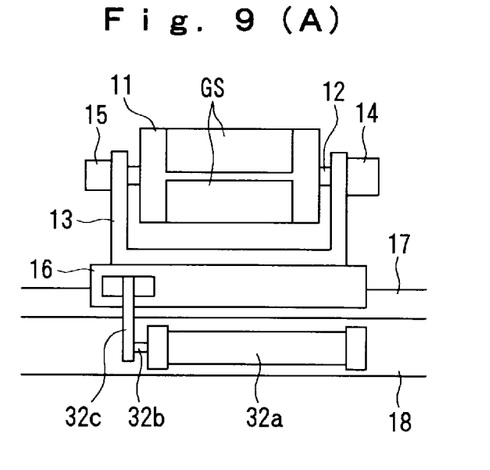
FIGS. 9(A) and 9(B) are views showing another example of an antivibration mechanism.

FIG. 9 shows another example of an antivibration mechanism. In this mechanism, a rod 32b of a cylinder 32a mounted on the base 18 is connected to the support frame 16 via a bracket 32c. The rod 32b is provided with a piston 32d, and the cylinder 32a is filled with damping oil 32e. According to this mechanism, by using the resistance that the piston 32d receives from the damping oil 32e, the occurrence of vibrations can be restrained and also vibration damping can be performed effectively. The outside diameter of the piston 32d may be either smaller than or equal to the inside diameter of the cylinder 32a.

Figure 10:
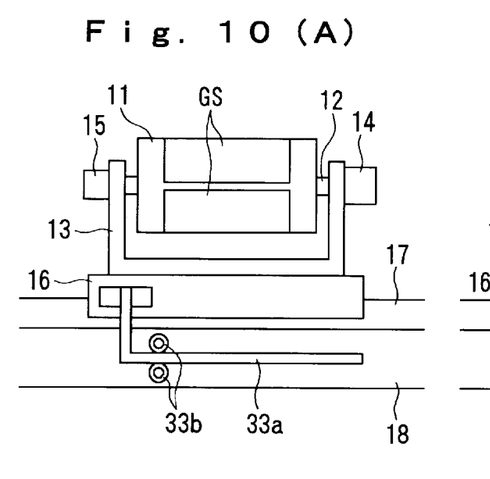
FIGS. 10(A) and 10(B) are views showing still another example of an antivibration mechanism.

FIG. 10 shows still another example of an antivibration mechanism. In FIG. 10(A), a plate 33a mounted on the support frame 16 is inserted, in a contacting state, between two rollers 33b provided on the base 18. In FIG. 10(B), a plate 34a mounted on the support frame 16 is inserted, in a non-contacting state, between two magnets 34b provided on the base 18. According to these mechanisms, by using the contact resistance with the rollers 33b or the resistance caused by magnetic force of the magnets 34b, the occurrence of vibrations can be restrained and also vibration damping can be performed effectively. Needless to say, the number of rollers 33b or magnets 34b may be one. Also, if the shaft of the roller 33b is connected to a motor (not shown), the timing of resistance exertion can be controlled by the power supply to the motor.

Figure 11:
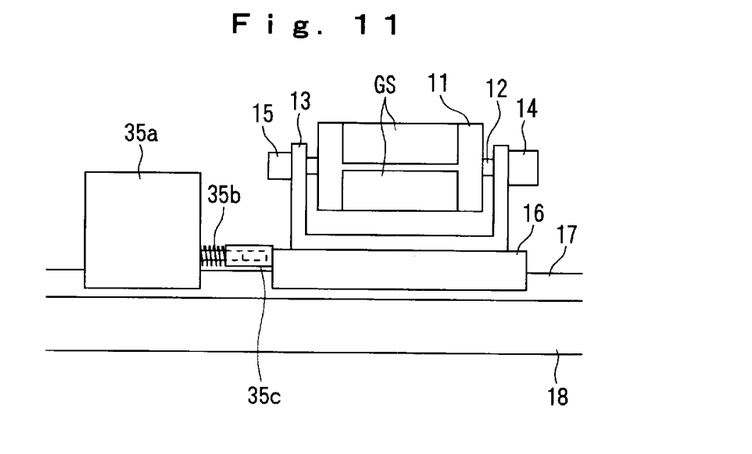
FIG. 11 is a view showing still another example of an antivibration mechanism.

FIG. 11 shows still another example of an antivibration mechanism. In this mechanism, a weight 35a is movably put on the rail 17, and a contact member 35c urged by a spring 35b is provided on this weight 35a so that the contact member 35c can come in contact with the rail guide 16 or the support frame 13. According to this mechanism, by using the resistance caused by the weight of the weight 35a, the occurrence of vibrations can be restrained and also vibration damping can be performed effectively by the spring 35b.

Also, in the above-described embodiment, the drum is rotated at a predetermined speed by the motor 14. In order to rotate the drum 11 stably, rotation stabilizing measures as described below may be taken.

Specifically, a part of the drum shaft 12 or the shaft of the motor 14 is put in a vessel filled with a viscous material such as grease so that a viscous resistance is always exerted to the drum shaft 12 or the motor 14. Thereby, drum ripples or motor ripples can be restrained and the rotation can be made smooth.

Figure 12:
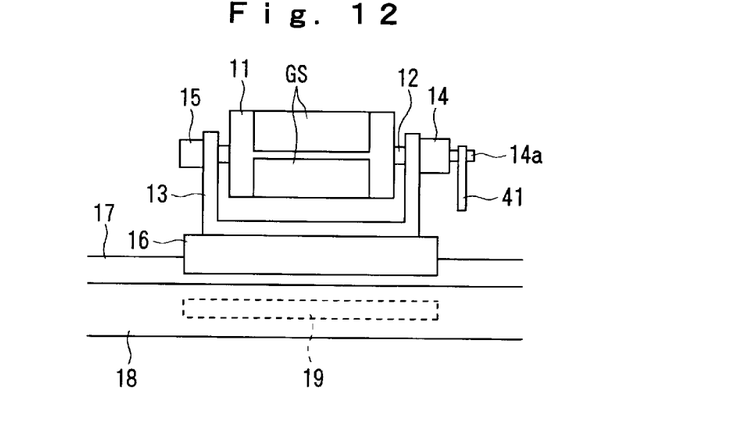
FIG. 12 is a view showing one example of a rotation stabilizing mechanism.

FIG. 12 shows one example of a rotation stabilizing mechanism, in which a flywheel 41 is mounted on a shaft 14a of the motor 14. According to this mechanism, by increasing the moment of inertia of the motor shaft 14a, motor ripples can be restrained and thereby the rotation can be made smooth.

Figure 13:
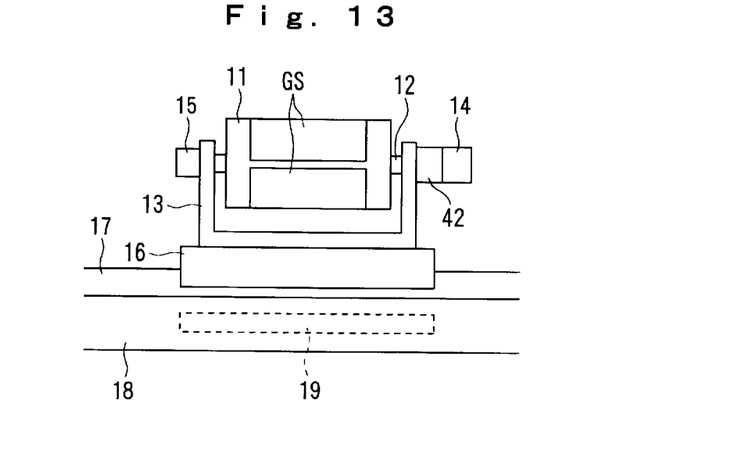
FIG. 13 is a view showing another example of a rotation stabilizing mechanism.

FIG. 13 shows another example of a rotation stabilizing mechanism, in which a reduction gear 42 is provided on the motor 14, and the drum shaft 12 is connected to this reduction gear 42. According to this mechanism, by using a speed reducing effect caused by the reduction gear 42, the cycle of motor ripple is increased, whereby the rotation can be made smooth. In this case, the motor 14 can be used in a stable region with less ripple and also the rotational speed of the drum 11 can be controlled by the reduction gear 42. Also, although not shown in the figure, by providing two motors 14, motor ripples are offset or evened up and thereby the rotation can be made smooth.

Figure 14:
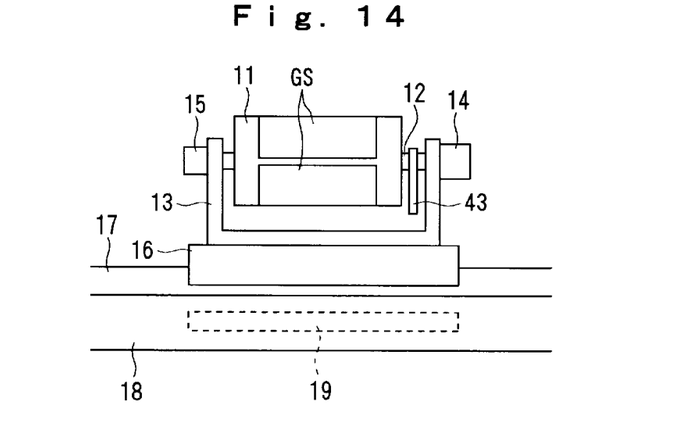
FIG. 14 is a view showing still another example of a rotation stabilizing mechanism.

FIG. 14 shows still another example of a rotation stabilizing mechanism, in which a flywheel 43 is installed on one or both of the drum shafts 12. According to this mechanism, by increasing the moment of inertia of the drum shaft 12, drum ripples are restrained and thereby the rotation can be made smooth.

Further, in the above-described embodiment, the drum 11 is rotated and moved by the motor 14 and the linear motor 19, respectively. In order to overcome a problem of thermal expansion etc. caused by heat generated by the motors 14 and 19, measures as described below or cooling measures may be taken.

Specifically, the processing work is performed after the drum 11 has been rotated for a predetermined time by the motor 14 so that the drum 11, the drum shafts 12, and the support frame 13, or the like are stabilized thermally. Thereby, the influence of thermal expansion caused by temperature rise can be reduced. Also, the thermal cutoff of heat transfer path from the motor 14, 19, which is a heat source, effected by a heat insulating material or the like can achieve the same effect.

Figure 15:
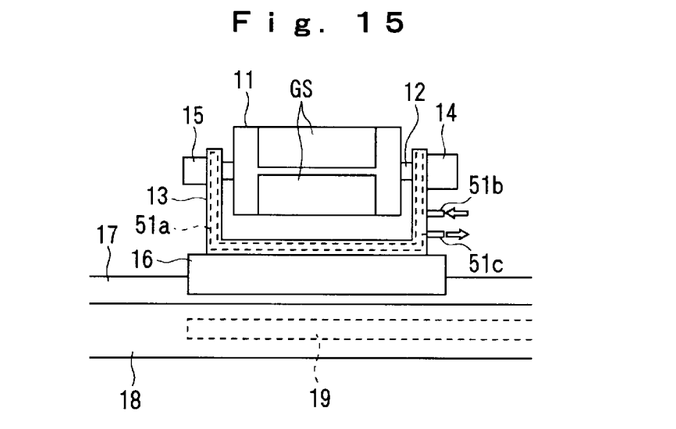
FIG. 15 is a view showing one example of a cooling mechanism.

FIG. 15 shows one example of a cooling mechanism, in which a cooling passage 51a is provided in the support frame 13 to cause a cooling fluid to flow from an inlet 51b toward an outlet 51c. According to this mechanism, by causing a cooling fluid such as water to flow in the cooling passage 51a, the heat generated in the motor 14 and the linear motor 19 and the transferred heat are cooled by the cooling fluid, whereby a problem of thermal expansion etc. can be overcome. Needless to say, the same cooling passage as described above may be provided separately around the linear motor 19.

Figure 16:
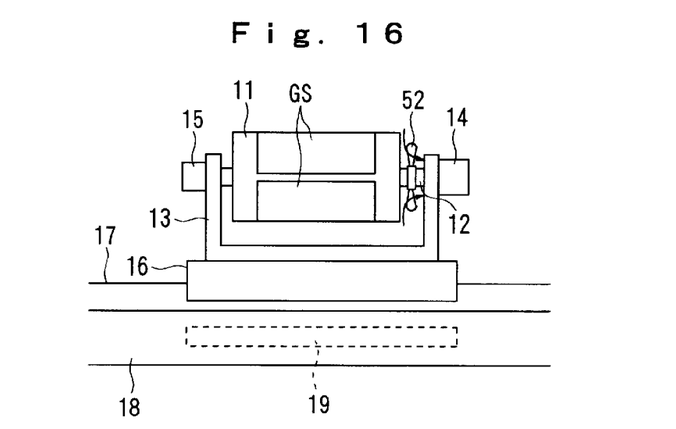
FIG. 16 is a view showing another example of a cooling mechanism.

FIG. 16 shows another example of a cooling mechanism, in which a propeller fan 52 is provided on one or both of the drum shafts 12. According to this mechanism, the propeller fan 52 is rotated in synchronism with the drum shaft 12 to form an air flow directed toward the motor 14 and the linear motor 19. Thereby, the heat generated in the motor 14 and the linear motor 19 and the transferred heat are cooled by the air flow, whereby a problem of thermal expansion etc. can be overcome.

Figure 17:
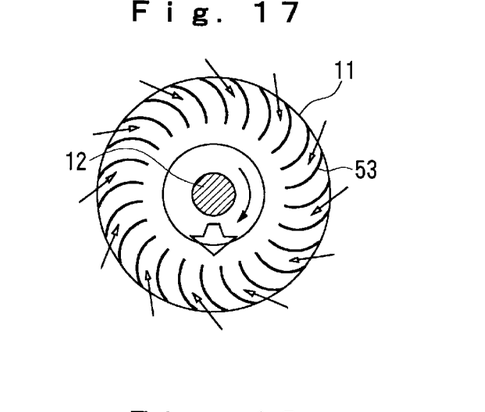
FIG. 17 is a view showing still another example of a cooling mechanism.

FIG. 17 shows still another example of a cooling mechanism, in which a multiblade (sirrocco) fan 53 is provided on the end face of the drum 11. According to this mechanism, the multiblade fan 53 is rotated in synchronism with the drum 11 to form an air flow directed toward the motor 14 and the linear motor 19. Thereby, the heat generated in the motor 14 and the linear motor 19 and the transferred heat are cooled by the air flow, whereby a problem of thermal expansion etc. can be overcome.

Figure 18:
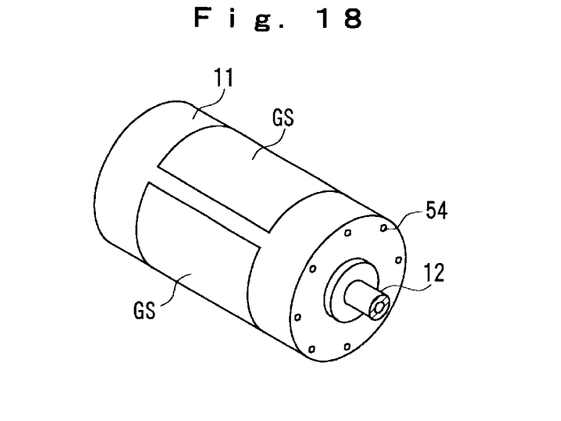
FIG. 18 is a view showing still another example of a cooling mechanism.

FIG. 18 shows still another example of a cooling mechanism, in which cooling holes 54 communicating with the inside cavity are formed in the end face of the drum 11. According to this mechanism, by using the negative pressure for attaching the green sheets GS on the outer peripheral surface of the drum 11, the outside air is sucked through the cooling holes 54. Therefore, the drum heat can be cooled by the flowing-in outside air.

Further, in the above-described embodiment, the shield plate 7 is disposed to prevent the objective lens 6 from being stained by processing dust created when the laser beam LB is applied to the green sheet GS. When the processing dust scatters to the surroundings, and thereby adheres to the green sheet GS and peripheral equipment other than the objective lens 6, or pollutes the atmosphere, a dust removing mechanism as shown in FIG. 19 may be provided.

Figure 19:
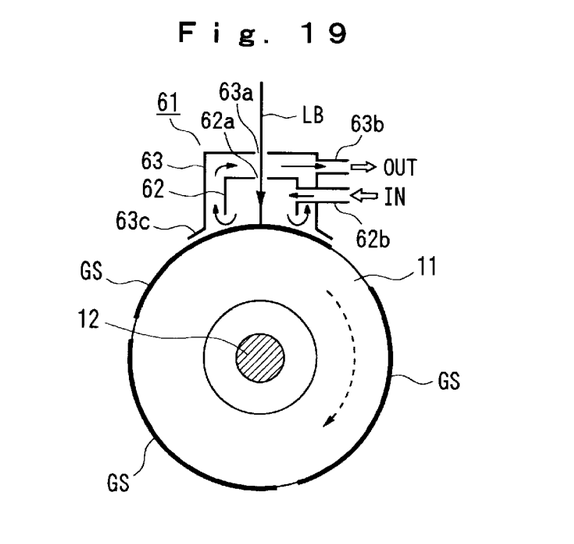
FIG. 19 is a view showing one example of a dust removing mechanism.

The dust removing mechanism 61 shown in FIG. 19 comprises an inside cover 62 which covers a laser beam irradiated portion of the green sheet GS in a non-contact state and an outside cover 63 which is on the outside of the inside cover 62 so as to be not in contact with the laser beam irradiated portion. The inside cover 62 has a laser beam penetrating hole 62a and an air suction port 62b, and the outside cover 63 has a laser beam penetrating hole 63a, an air discharge port 63b, and a collar 63c. Needless to say, the laser beam penetrating hole 62a, 63a may be not a hole but may be a transparent material portion allowing the laser beam LB to pass through. If a supply source such as an air compressor is connected to the air suction port 62b or a suction source such as a vacuum pump is connected to the air discharge port 63b and is operated, the air taken from the outside through the air suction port 62b, together with the processing dust created during the processing, can be discharged to the outside through the air discharge port 63b.

Figure 20:
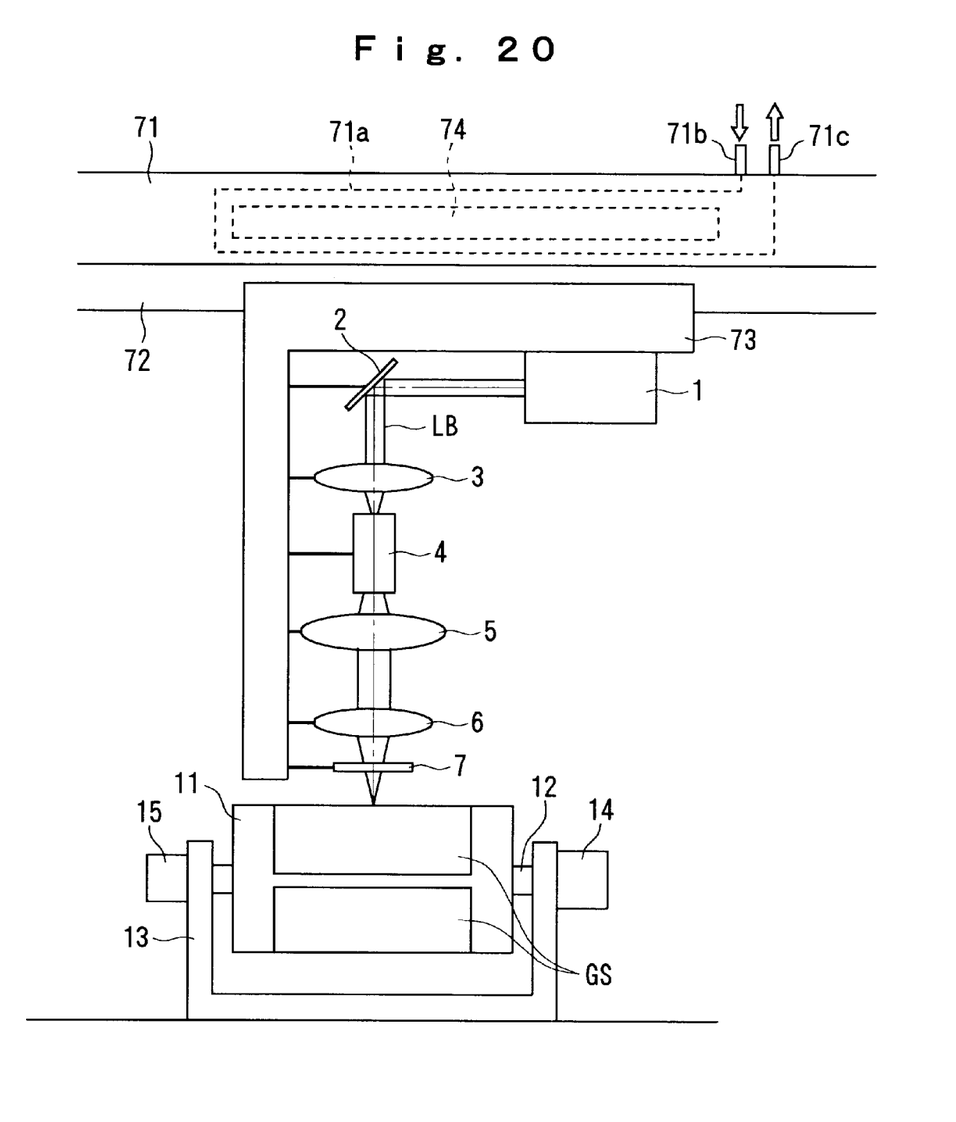
FIG. 20 is a schematic view of an apparatus in accordance with another embodiment of the present invention.

FIG. 20 schematically shows an apparatus in accordance with another embodiment of the present invention. This embodiment differs from the embodiment shown in FIG. 1 in that a slider 73 provided with a rail guide is movably disposed on a rail 72 provided on a top plate 71, that an optical system including the laser oscillator 1 is installed to the slider 73, and that a linear motor 74 for moving the slider 73 is provided. Also, a cooling passage 71a is provided around the linear motor 74 so that a cooling fluid flows from an inlet 71b of the cooling passage 71a toward an outlet 71c thereof. Other constructions are the same as those of the apparatus shown in FIG. 1, so that the same reference numerals are applied and the explanation of the same constructions is omitted.

In this apparatus, a laser beam LB is applied intermittently to the green sheets GS attached on the outer peripheral surface of the drum 11 while the drum 11 is rotated at a predetermined rotating speed by the motor 14. Thereby, a row of through holes arranging at equal intervals in the circumferential direction is formed in the green sheet GS. Also, just before the drum 11 makes one turn, the slider 73, that is, the optical system including the laser oscillator 1 is moved through a predetermined distance in the direction parallel to the drum centerline by the linear motor 74. Thereby, a desired matrix of through holes can be formed in the green sheets GS.

The operation and effects obtained by this embodiment are the same as those obtained by the embodiment shown in FIG. 1. Also, according to this embodiment, by causing a cooling fluid such as water to flow in the cooling passage 71a, the heat generated in the linear motor 74 for moving the slider 73 and the transferred heat are cooled by the cooling fluid, whereby a problem of thermal expansion etc. can be overcome. Needless to say, when vibrations are generated by the stoppage of the movement of the slider 73, the aforementioned antivibration measures can be adopted, and also the aforementioned rotation stabilizing measures and cooling measures can be adopted.

In the embodiments shown in FIGS. 1 and 20, apparatuses are shown in which just before the drum 11 makes one turn, the drum 11 is moved through a predetermined distance in the direction of centerline of the drum 11, or just before the drum 11 makes one turn, the optical system including the laser oscillator 1 is moved through a predetermined distance in the direction parallel to the drum centerline. However, if the processing path is formed in a spiral form on the outer peripheral surface of the drum 11, a matrix of through holes can be formed in the green sheets GS without moving the drum 11 or the optical system including the laser oscillator 1 in the direction of drum centerline just before the drum 11 makes one turn. In this case, the direction of the green sheet GS attached on the outer peripheral surface of the drum 11 may be such that the sheet side on the drum end side is in parallel to the spiral processing path or such that the sheet side on the drum end side is in parallel to the drum end.

Specifically, in the embodiment shown in FIG. 1, if the laser beam LB is applied intermittently to the green sheets GS while the drum 11 is rotated at a preset rotational speed by the motor 14 and the drum 11 is moved at a predetermined speed in the direction of drum centerline by the linear motor 19, a matrix of through holes can be formed on a spiral path in the green sheets GS attached on the outer peripheral surface of the drum 11 without the stoppage of the drum 11. Also, in the embodiment shown in FIG. 20, if the laser beam LB is applied intermittently to the green sheets GS while the drum 11 is rotated at a preset rotational speed by the motor 14 and the optical system including the laser oscillator 1 is moved at a predetermined speed in the direction parallel to the drum centerline, a matrix of through holes can be formed on a spiral path in the green sheets GS attached on the outer peripheral surface of the drum 11 without the stoppage of the drum 11.

Also, in the embodiment shown in FIG. 1, the apparatus is configured so that the drum 11 can be moved in the direction of centerline of the drum 11, and in the embodiment shown in FIG. 20, the apparatus is configured so that the optical system including the laser oscillator 1 can be moved in the direction of drum centerline. However, if the apparatus is configured so that both of the drum 11 and the optical system can be moved by linear motors or the like, the drum and the laser irradiated position can be moved at a higher speed in the direction of drum centerline by moving both the elements in the direction such that they are opposed to each other.

Further, needless to say, various beam irradiating means for applying the laser beam LB to the green sheet GS other than those shown in the embodiments shown in FIGS. 1 and 20 can be used. For example, a beam irradiating mechanism in which a part (for example, between the relay lens 5 and the objective lens 6) of the path of laser beam LB is formed by an optical fiber, or a beam irradiating means in which the beam irradiated position can be changed by using a galvanometer mirror may be used. If the beam irradiating means of the former configuration is used, the weight of the movement portion in the apparatus in which the beam irradiating mechanism is moved in the processing process can be reduced. By this reduction in weight, the aforementioned vibrations at the time of the stoppage of the movement can be decreased. If the beam irradiating means of the latter configuration is used, by changing the direction of the galvanometer mirror by a driving mechanism without moving the drum or the beam irradiating means, the beam irradiated position with respect to the green sheet can be changed, and also the problem of vibrations as described above does not occur when the drum or the beam irradiating means is moved.

Further, when vibrations occur in a case other than the case where the drum and the beam irradiating means are moved in the direction of drum centerline and stopped, for example, when vibrations are generated by the movement of the drum and the beam irradiating means in the direction of drum centerline or the rotation of the drum, well-known measures for controlling the vibrations may be taken separately. For example, addition such as a vibration damping material may be separately added to the vibration occurring portion.

Further, in the embodiments shown in FIGS. 1 and 20, apparatuses are shown in which a matrix of through holes are formed in the green sheets GS. However, if the energy of the irradiated laser beam is lowered, a matrix of concave portions can be formed in the green sheets GS. Also, if the irradiation shape of laser beam LB with respect to the green sheet GS is changed by using a mask or the like, holes or concave portions having a shape other than the circular shape can be formed in the green sheet GS. Further, if the laser beam LB is applied continuously to the green sheet GS, the green sheet GS can be cut to a zonation shape or a spiral shape, or parallel or spiral concave portions can be formed in the green sheet GS.

The preferred embodiments described in this specification are typical ones, and the invention is not limited thereto. The scope of the invention is shown by the appended claims, and all modifications included in the meaning of these claims are included in the present invention.

What is claimed is:

1. A method of processing a plurality of ceramic green sheets with a laser beam and a cylindrical drum having a peripheral surface with an axis of drum rotation comprising the steps of:

rotating the cylindrical drum about the axis while the plurality of ceramic green sheets are simultaneously fixedly attached to the peripheral surface;

processing the ceramic green sheets simultaneously fixedly attached to the peripheral surface along a circular processing path by causing the laser beam to be incident on the sheets while the sheets are fixedly attached to the peripheral surface of the drum;

changing the processing path by moving at least one of the rotating drum and the incident beam position on the sheets while the sheets are fixedly attached to the peripheral surface, the moving of at least one of the rotating drum and the incident beam being by a predetermined distance in the direction of the drum axis each time the processing along the circular path is completed.

2. The method according to claim 1, wherein:

the drum is rotated at a constant speed about the axis, and the laser beam is intermittently incident on the sheets while the sheets are fixedly attached to the peripheral surface and the drum is rotated at the constant speed about the axis.

3. The method according to claim 2, wherein:

the laser beam is caused to be intermittently incident on the fixedly attached green sheets by intermittently directing the laser beam onto the green sheets each time the drum turns about the axis through a predetermined angle.

4. The method according to claim 1, wherein:

the laser beam incident on at least one of the fixedly attached green sheets has energy enough to form a through hole in the at least one of the ceramic green sheets.

5. The method according to claim 1, wherein:

the laser beam incident on at least one of the fixedly attached green sheets has energy enough to form a concave portion in the at least one of the ceramic green sheets without forming a through hole.

6. The method according to claim 1, wherein:

the ceramic green sheets are attached on the peripheral surface of the drum and the drum is rotated and the beam is directed to be incident on the fixedly attached sheets so as to form a gap for the processing path change.

7. The method according to claim 1, further comprising:

supporting one surface of the ceramic green sheets on a base film, the base film side being on the peripheral surface of the drum.

8. The method of claim 1 further including removing the ceramic green sheets after they have been processed on the cylindrical drum.

9. A method of processing a ceramic green sheet with a laser beam and a cylindrical drum having a peripheral surface coaxial with an axis of drum rotation, comprising the steps of:

rotating the cylindrical drum about the axis while the ceramic green sheet is fixedly attached to the peripheral surface; and processing the ceramic green sheet along a spiral path by causing the laser beam to be incident on the ceramic green sheet while the sheet is fixedly attached to the peripheral surface of the rotating drum while moving, in the direction of the drum axis, at least one of the rotating drum and the incident beam position on the sheet.

10. The method according to claim 9, wherein:

the drum is rotated at a constant speed about the axis, and the laser beam is intermittently incident on the sheet while the sheet is fixedly attached to the peripheral surface and the drum is rotated at the constant speed about the axis.

11. The method according to claim 10, wherein:

the laser beam is caused to be intermittently incident on the fixedly attached green sheet by intermittently directing the laser beam onto the green sheet each time the drum turns about the axis through a predetermined angle.

12. The method according to claim 9, wherein:

the laser beam incident on the fixedly attached green sheet has energy enough to form a through hole in the ceramic green sheet.

13. The method according to claim 9, wherein:

the laser beam incident on the fixedly attached green sheet has energy enough to form a concave portion in the ceramic green sheet without forming a through hole.

14. The method according to claim 9, wherein:

a plurality of ceramic green sheets are attached on the outer peripheral surface of the drum and the drum is rotated and the beam is directed to be incident on the fixedly attached sheet, and the same processing is performed on the plurality of ceramic green sheets.

15. The method according to claim 9, further comprising:

supporting one surface of the ceramic green sheet on a base film, the base film side attached on the peripheral surface of the drum.

16. The method of claim 9 further including removing the ceramic green sheet after it has been processed on the cylindrical drum.

17. A method of processing a plurality of ceramic green sheets with an energy beam and a drum having a peripheral surface coaxial with an axis of drum rotation comprising the steps of:

fixedly attaching the sheets on the peripheral surface so the sheets are simultaneously fixedly attached to the peripheral surface;

rotating the drum about the axis while the sheets are fixedly attached to the peripheral surface;

directing the energy beam so it is incident on the ceramic green sheets while the ceramic green sheets are fixedly attached to the peripheral surface and the drum is rotating about the axis;

the energy beam when incident on the ceramic green sheets having sufficient power to remove material from the ceramic green sheets; and changing the relative position of the energy beam and the ceramic green sheets along the direction of the axis as the green sheets rotate about the axis and are fixedly attached to the surface.

18. The method according to claim 17, wherein:

the sheets are rotated at a fixed speed about the axis, and the beam irradiates the ceramic green sheets intermittently.

19. The method according to claim 18, wherein:
the beam intermittently irradiates the green sheets by causing the beam to be incident on the green sheets each time the drum rotates through a predetermined angle about the axis.

20. The method according to claim 17, wherein:
the beam irradiating at least one of the green sheets has sufficient energy to form a through hole in the at least one of the ceramic green sheets.

21. The method according to claim 17, wherein:
the beam irradiating at least one of the green sheets has sufficient energy to form a concave portion in the at least one of the ceramic green sheets without forming a through hole in the at least one of the ceramic green sheets.

22. The method according to claim 17, wherein:
the ceramic green sheets are fixedly attached to the peripheral surface of the drum rotating about the axis in a processing path by the energy beam so as to form a matrix of processed areas on the green sheets, the matrix including columns and rows with gaps between adjacent columns of the processed areas resulting from changes in processing paths by the energy beam as incident on the ceramic green sheets.

23. The method according to claim 17 further including:
supporting one surface of the ceramic green sheets on a base film on a peripheral surface of the drum while the drum rotates about the axis.

24. The method of claim 17 further including changing the relative position of the energy beam and the green sheets while the drum is rotating about the axis and the sheets are fixedly attached to the surface so that the energy beam is incident on a spiral path of the green sheets.

25. The method according to claim 24, wherein:
the drum is rotated at a fixed speed about the axis while the sheets are fixedly attached to the surface, causing the beam to be incident on the ceramic green sheets intermittently while the drum is rotating about the axis and the sheets are fixedly attached to the surface.

26. The method according to claim 25, wherein:
the beam is intermittently incident on the green sheets by causing the beam to be incident on the green sheets each time the drum rotates through a predetermined angle while the sheets are fixedly attached to the surface.

27. The method according to claim 24, wherein:
the beam irradiating the green sheets has sufficient energy to form a through hole in at least one of the ceramic green sheets.

28. The method according to claim 24, wherein:
the beam incident on at least one of the green sheets has sufficient energy to form a concave portion in the at least one of the ceramic green sheets without forming a through hole.

29. The method according to claim 24, further including:
changing the relative position of the energy beam and the green sheets while the drum is rotating about the axis and the sheets are fixedly attached to the surface so as to form transverse gaps between process areas of the green sheets as a result of changes in processing paths the energy beam relative to the drum axis.

30. The method according to claim 24, further including:
supporting one surface of the ceramic green sheets on a peripheral surface of the drum while the drum rotates about the axis.

31. The method according to claim 17, wherein the energy beam is a laser beam.

32. The method of claim 17 wherein the relative position of the incident energy beam and the ceramic green sheets as the green sheets rotate about the axis is such that the energy beam is incident on a portion of the fixedly attached green sheets at the same position relative to the axis while the drum rotates through one turn about the axis.

33. The method of claim 32 wherein the relative position of the incident energy beam and the fixedly attached ceramic green sheets as the drum rotates about the axis is such that the energy beam is incident on the same portions of the green sheets as it was incident during said one turn while the fixedly mounted green sheets rotate through more than one turn about the axis.

34. The method of claim 33 further comprising shifting the relative axial positions of the incident energy beam and the ceramic green sheets after the drum rotates through said one turn.

35. The method of claim 32 further comprising shifting the relative axial positions of the incident energy beam and the ceramic green sheets after the drum rotates through said one turn.

36. The method of claim 17 wherein the relative position of the incident energy beam and the ceramic green sheets as the drum rotates about the axis is such that the energy beam is incident on a spiral path of the green sheets.

37. The method of claim 36 wherein the relative position of the incident energy beam and the ceramic green sheets as the drum rotates about the axis is such that the energy beam is incident on different positions of the green sheets relative to the axis at different angular positions of the drum periphery relative to an axis of the beam as incident on the sheets.

38. The method of claim 17 wherein the relative position is changed by moving an axis of the beam as incident on the green sheets relative to the drum axis.

39. The method of claim 17 wherein the relative position is changed by moving the drum along its axis.

40. The method of claim 17 wherein the relative position is changed by moving an axis of the beam along the drum axis while moving the drum along its axis.

41. The method of claim 40 wherein the beam and drum axes are moved in opposite directions.

42. The method of claim 17 further including removing the ceramic green sheets after they have been processed on the cylindrical drum.

* * * * *